(12) United States Patent
Caimi et al.

(10) Patent No.: US 9,953,125 B2
(45) Date of Patent: Apr. 24, 2018

(54) DESIGN/TECHNOLOGY CO-OPTIMIZATION PLATFORM FOR HIGH-MOBILITY CHANNELS CMOS TECHNOLOGY

(71) Applicant: International Business Machines Corporation, Armonk, NY (US)

(72) Inventors: Daniele Caimi, Besenbueren (CH); Lukas Czornomaz, Zurich (CH); Veeresh V. Deshpande, Zurich (CH); Vladimir Djara, Kilchberg (CH); Jean Fompeyrine, Waedenswil (CH)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 15/183,333

(22) Filed: Jun. 15, 2016

(65) Prior Publication Data
US 2017/0364623 A1    Dec. 21, 2017

(51) Int. Cl.
*G06F 17/50* (2006.01)
*H01L 27/11* (2006.01)
(Continued)

(52) U.S. Cl.
CPC ...... *G06F 17/5072* (2013.01); *H01L 27/1104* (2013.01); *H01L 27/0605* (2013.01); *H01L 27/0886* (2013.01)

(58) Field of Classification Search
CPC .......................... G06F 17/5072; H01L 27/1104
(Continued)

(56) References Cited

U.S. PATENT DOCUMENTS

| 8,835,988 B2 | 9/2014 | Marino et al. |
| 2008/0070423 A1* | 3/2008 | Crowder ............ H01L 21/2026 438/795 |

(Continued)

OTHER PUBLICATIONS

Sciacca, "3D-stacked hybrid SRAM cell to be built by European scientists", http://phys.org/news/2014-02-3d-stacked-hybrid-sram-cell-built.html, Feb. 4, 2014, pp. 1-2.
(Continued)

*Primary Examiner* — Stacy Whitmore
(74) *Attorney, Agent, or Firm* — Scully, Scott, Murphy & Presser, P.C.; Daniel Morris, Esq.

(57) ABSTRACT

Embodiments of the present invention may provide the capability to design SRAM cells may be designed that is compatible with the requirements of InGaAs integration by selective epitaxy in $SiO_2$ cavities without sacrificing density and area scaling. In an embodiment of the present invention, a computer-implemented method for designing a hybrid integrated circuit may comprise receiving data representing a layout of a static random-access memory cell array, identifying areas between active channel regions that do not overlap with transistor gates of static random-access memory cells of the static random-access memory cell array, selecting from among the identified areas at least one area, expanding the selected areas to determine whether the expanded area intersects with a p-doped active Si semiconductor or p-channel semiconductor area, and marking as Si seed locations the identified expanded areas that do not intersect on both sides with a channel active transistor region.

18 Claims, 12 Drawing Sheets

(51) Int. Cl.
    *H01L 27/088* (2006.01)
    *H01L 27/06* (2006.01)
(58) Field of Classification Search
    USPC .......................................................... 716/119
    See application file for complete search history.

(56) References Cited

U.S. PATENT DOCUMENTS

2009/0078940 A1* 3/2009 Afentakis ........... H01L 29/6675
                                                              257/64
2014/0307997 A1   10/2014 Bar et al.
2015/0287642 A1   10/2015 Chang et al.
2016/0365416 A1* 12/2016 Metz ................. H01L 29/66522
2017/0207126 A1*  7/2017 Ching ............. H01L 21/823431

OTHER PUBLICATIONS

Dai et al., "Novel Heterogeneous Intergration Technology of III-V Layers and InGaAs FinFETs to Silicon", Advanced Functional Materials 2014, www.afm-journal.de, http://web.spms.ntu.edu.sg/~oson/publications/papers/Adv%20Func%20Mat%20(2014).pdf, 2014 Wiley-VCH Verlag GmbH & Co. KGaA, Weinheim, pp. 1-7.
Czornomaz et al., "Co-integration of InGaAs n- and SiGe p-MOSFETs into digital CMOS circuits using hybrid dual-channel ETXOL substrates", http://ieeexplore.ieee.org/epl/abstractAuthors.jsp?tp=&arnumber=6724548&url=http%3A%2F%2Fieeexplore.ieee.org%2Fxpls%2Fabs_all.jsp%3Farnumber%3D6724548, 2013 IEEE International Electron Devices Meeting, Dec. 9-11, 2013, Abstract only.

* cited by examiner

DESIGN/TECHNOLOGY CO-OPTIMIZATION PLATFORM FOR HIGH-MOBILITY CHANNELS CMOS TECHNOLOGY

FIELD

The present disclosure to techniques for designing hybrid integrated circuits.

BACKGROUND

High density integration of high-mobility channel materials for CMOS technology is an enormous challenge for the semiconductor industry. Typically, SRAM arrays are the most dense pattern on a CPU layout. Therefore, it is the most critical circuit for any advanced CMOS technology featuring heterogeneous integration of high mobility channel materials. Materials such as InGaAs nFETs and SiGe pFETs are among the leading candidates for sub-10 nm nodes. Currently, the industry preferred approach to integrate InGaAs on Si relies on selective epitaxy in $SiO_2$ cavities.

In order to deal with the challenges involved in such circuitry, Design/Technology co-optimization has become a strategic field for CMOS manufacturers. This means that device technology and circuit design cannot anymore be treated as two separate entities. Strong requirements may exist on the technology side which strongly impact the design and vice-versa. Introducing InGaAs by selective epitaxy in $SiO_2$ cavities into CMOS manufacturing will add another level of complexity on the technology side. This increased complexity has to be accounted for on the circuit design side.

Accordingly, a need arises for techniques by which SRAM cells may be designed that are compatible with the requirements of InGaAs integration by selective epitaxy in $SiO_2$ cavities without sacrificing density and area scaling.

SUMMARY

A system and method to provide the capability to design SRAM cells that are compatible with the requirements of InGaAs integration by selective epitaxy in $SiO_2$ cavities without sacrificing density and area scaling.

In an embodiment of the present disclosure, a computer-implemented method for designing a hybrid integrated circuit may comprise receiving data representing a layout of a static random-access memory cell array, identifying areas between active channel regions that do not overlap with transistor gates of static random-access memory cells of the static random-access memory cell array, selecting from among the identified areas at least one area, expanding the selected areas to determine whether the expanded area intersects with a p-doped active Si semiconductor or p-channel semiconductor area, and marking as Si seed locations the identified expanded areas that do not intersect on both sides with a channel active transistor region.

Each selected area may be expanded length-wise, width-wise, or both, to a maximum area or by a pre-determined amount. The hybrid integrated circuit may comprise Si or SiGe static random-access memory circuits and a III-V semiconductor material. The III-V semiconductor material may be InGaAs. The method may further comprise determining whether a spacing between active areas in the layout of the static random-access memory cell array is greater than a diameter of a Si seed. The static random-access memory cell array may comprise fin field effect transistors, and the method may further comprise determining whether a spacing between fins of adjacent transistors is greater than a fin pitch of the fin field effect transistors.

In an embodiment of the present disclosure, a computer program product for designing a hybrid integrated circuit may comprise a non-transitory computer readable storage having program instructions embodied therewith, the program instructions executable by a computer, to cause the computer to perform a method comprising receiving data representing a layout of a static random-access memory cell array, identifying areas between active channel regions that do not overlap with transistor gates of static random-access memory cells of the static random-access memory cell array, selecting from among the identified areas at least one area, expanding the selected areas to determine whether the expanded area intersects with a p-doped active Si semiconductor or p-channel semiconductor area, and marking as Si seed locations the identified expanded areas that do not intersect on both sides with a channel active transistor region.

In an embodiment of the present disclosure, a system for designing a hybrid integrated circuit may comprise a processor, memory accessible by the processor, and computer program instructions stored in the memory and executable by the processor to perform receiving data representing a layout of a static random-access memory cell array, identifying areas between active channel regions that do not overlap with transistor gates of static random-access memory cells of the static random-access memory cell array, selecting from among the identified areas at least one area, expanding the selected areas to determine whether the expanded area intersects with a p-doped active Si semiconductor or p-channel semiconductor area, and marking as Si seed locations the identified expanded areas that do not intersect on both sides with a channel active transistor region.

BRIEF DESCRIPTION OF THE DRAWINGS

The details of the present invention, both as to its structure and operation, can best be understood by referring to the accompanying drawings, in which like reference numbers and designations refer to like elements.

DETAILED DESCRIPTION

Embodiments of the present invention may provide the capability to design SRAM cells may be designed that is compatible with the requirements of InGaAs integration by selective epitaxy in SiO₂ cavities without sacrificing density and area scaling.

Figure 1:
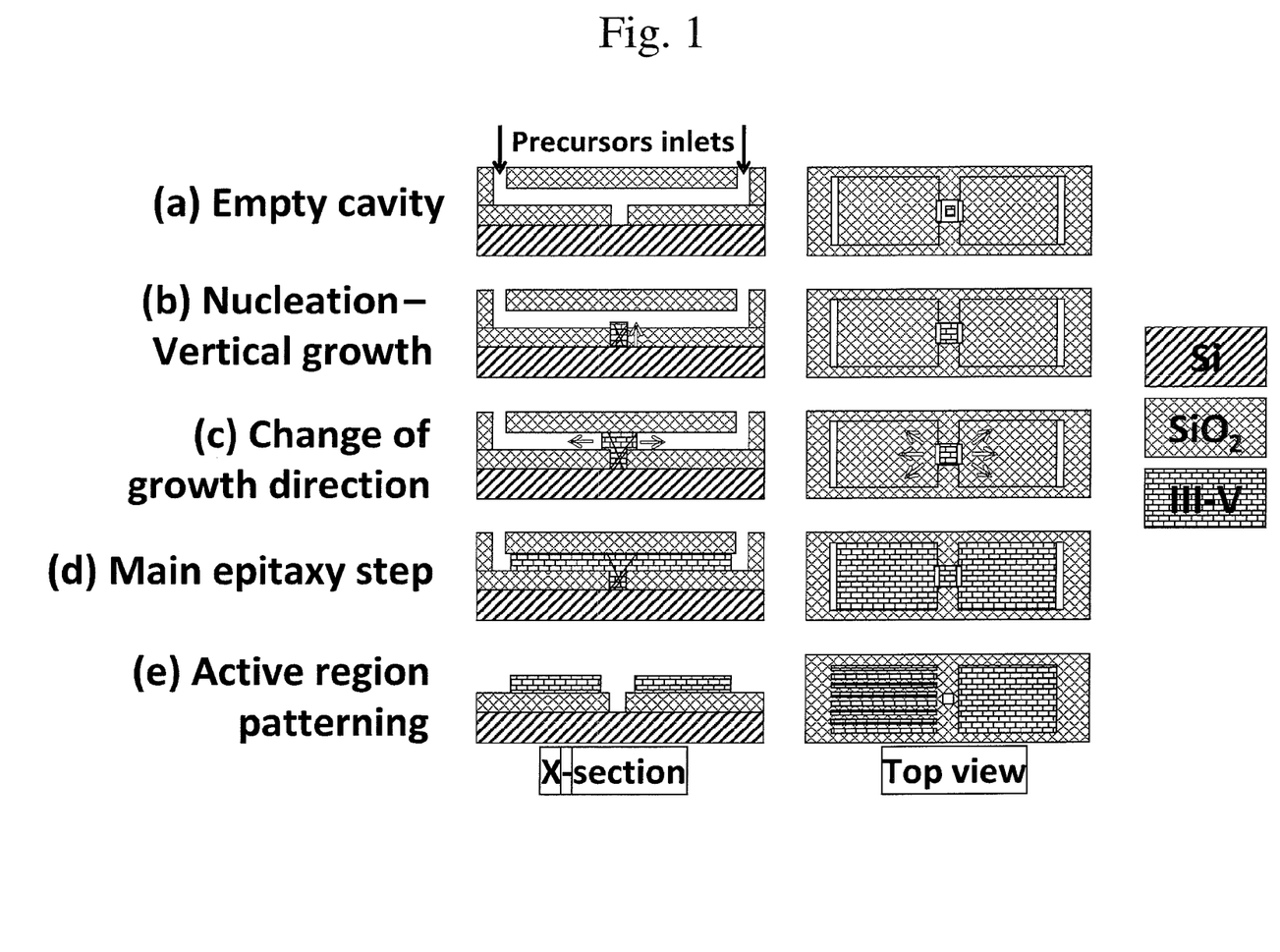
FIG. 1 is an exemplary process flow diagram of a process of InGaAs selective epitaxy.

An exemplary process of InGaAs selective epitaxy is shown in FIG. 1. In this example, InGaAs is integrated on Si for CMOS by growing it in empty SiO2 cavities. As shown at (a), an empty cavity is formed in SiO₂. At (b), a layer of III-V semiconductor material, such as InGaAs, is started to be grown. At (b), nucleation occurs and the layer is grown vertically. At (c), the growth direction of the III-V layer is changed. At (d), the main epitaxy step in which the layer is grown horizontally is performed. At (e), the active regions are patterned, to form the needed active region layers.

Figure 2:
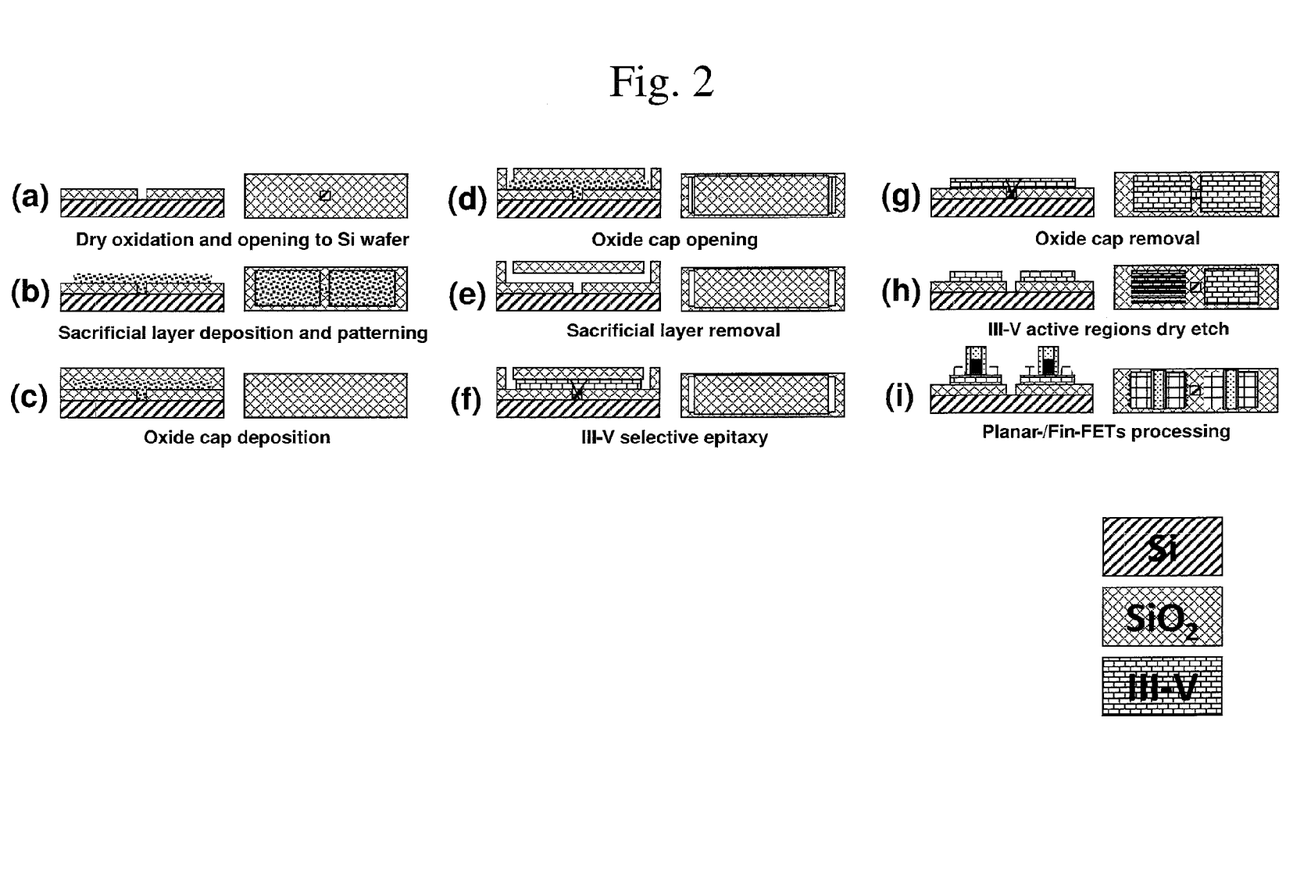
FIG. 2 is an exemplary process flow diagram of a process of lithography for InGaAs selective epitaxy.

An exemplary process of lithography for InGaAs selective epitaxy is shown in FIG. 2. At (a), the Si seed is formed by performing dry oxidation and forming an opening to the Si wafer. At (b)-(c), sacrificial material patterning is performed. At (b), the sacrificial layer is deposited and patterned, and at (c), an oxide cap is deposited. At (d)-(e), the cavity opening is formed. At (d), an opening is formed in the oxide cap. At (e), the sacrificial layer is removed. The process continues at (f), in which III-V selective epitaxy is performed to form the III-V layer, as shown in FIG. 1. At (g), the oxide cap is removed. At (h), the III-V active regions are dry etched. At (i), the planar FET and/or FIN-FET processing is completed.

Figure 3:
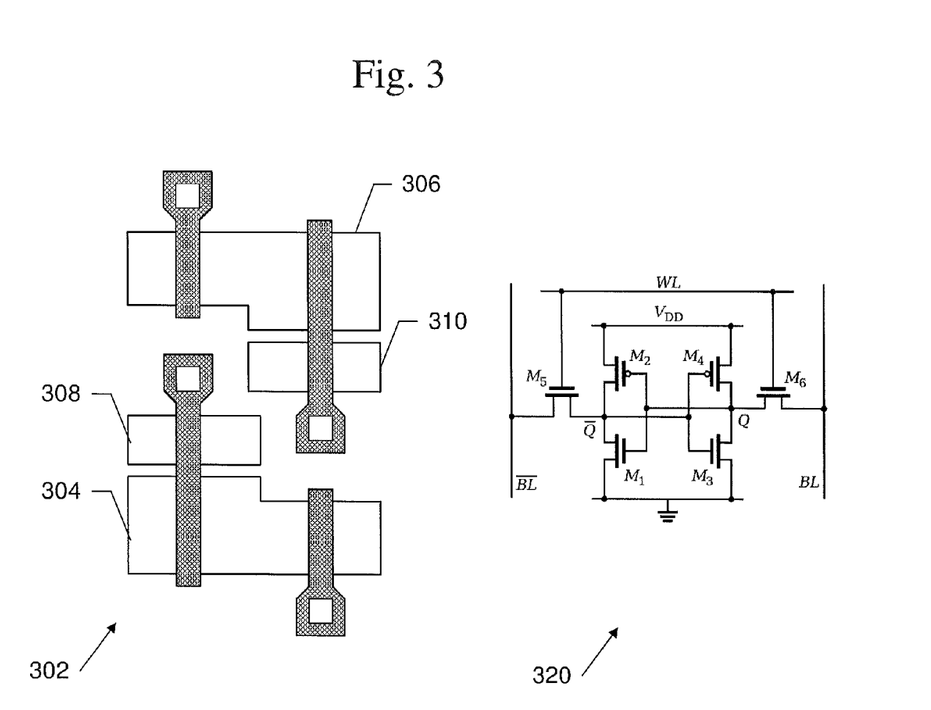
FIG. 3 is an exemplary diagram of a typical six-transistor static RAM cell layout.

A typical six-transistor static RAM cell layout 302 is shown in FIG. 3. Portions 304 and 306 are nFET material, while portions 308 and 310 are pFET material. A typical equivalent circuit 320 is also shown.

Design/Technology Co-Optimization may provide the capability to enable new technologies. In older CMOS generations, achievable pitch provided by design rules provided the capability to shrink circuit designs while confirming the design rules. For new generation CMOS, lithographic restrictions on allowed direction and minimum pitch, as well as active fin patterning, may be advantageously provided using standard cell designs.

Figure 4:
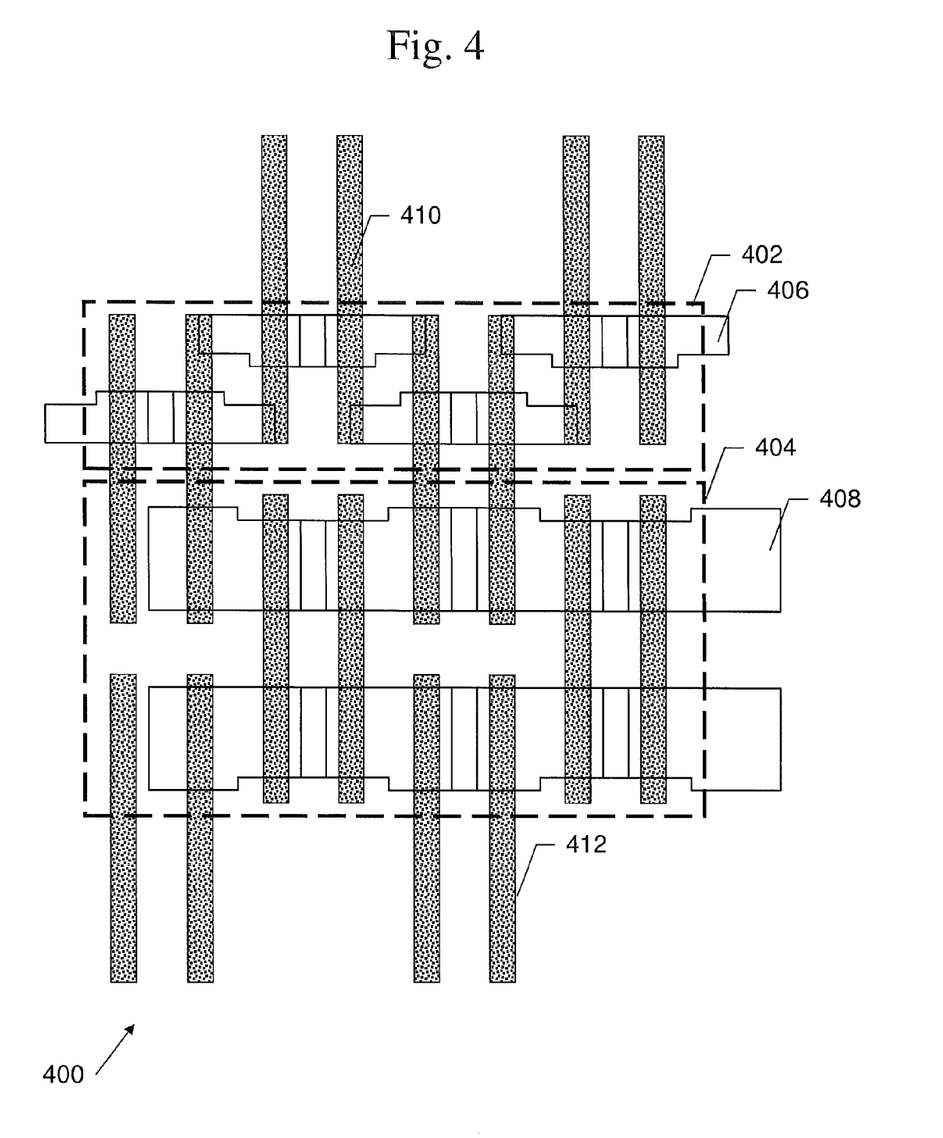
FIG. 4 is an exemplary diagram of an array of six-transistor static RAM cells.

An exemplary layout of an array 400 of an array of six-transistor static RAM cells is shown in FIG. 4. In this example, the doping regions are arranged contiguously. For example, the pFETs are arranged in a first area 402 of the array, while the nFETs are arranged in a second area 404 of the array. The array includes active channel semiconductor regions such as 406 and 408, and polysilicon or metal gate materials, such as 410 and 412.

Introducing InGaAs by selective epitaxy in SiO₂ cavities into CMOS manufacturing of such an array will add another level of complexity to the technology. Advantageously, this increased complexity may be accounted for on the circuit design side. Embodiments of the present invention may provide the capability to design a litho-friendly SRAM cell similar to CMOS SRAM cells using 14 nm or below nodes, while being optimized to an InGaAs selective epitaxy based CMOS process. A number of technological parameters may be considered to affect the process. For example, an InGaAs selective epitaxy based CMOS process typically requires two levels to be added to a standard CMOS SRAM layout. These layers may include a Si seed layer and a cavity open layer. One layer may be added as a modification from a standard SRAM isolated active channel semiconductor region, a sacrificial material level which connects the active n-channel region n active channel to the seed. The seed cannot overlap with the active n-channel region, or else the nFET body will be connected to the substrate. Likewise, the cavity open layer cannot overlap with gate conductor since a cavity open region would mean merging two crystals, and this merging may contain defects. Thus, it cannot be in the channel region of the device, only in the source/drain regions.

Figure 5:
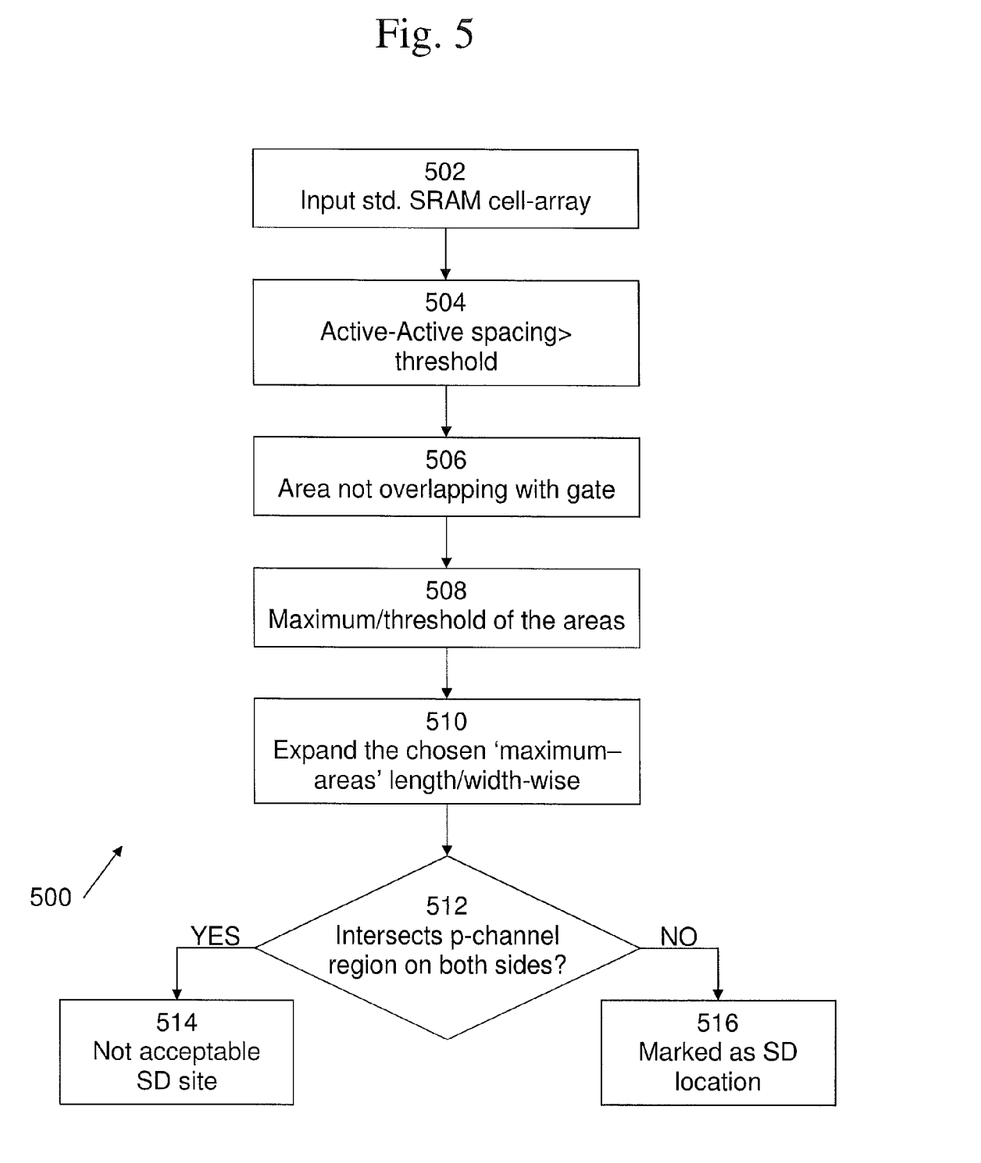
FIG. 5 is a proposed flow diagram of an SRAM layout process for hybrid channels (different n and p type channel materials).

An exemplary flow diagram of an SRAM layout process 500 is shown in FIG. 5. In this example, the cavity open location is either cell merge or active not under gate. Process 500 begins with 502, in which data representing a standard SRAM cell array may be input to, or received by, process 500. In 504, the spacing between active areas in the received standard SRAM cell array may be checked to determine whether the spacing is greater than a threshold, such as the seed diameter. In 506, it may be determined whether or not the area in which the selective epitaxy would be performed would overlap with a gate at the identified spacing. In 508, the maximum area in which the selective epitaxy would be performed that would not overlap with a gate at the identified spacing may be determined. This may done either by choosing the 'maximum areas' or by choosing areas above a certain pre-determined amount (for example, from 50-100% of the maximum area.) In 510, the area in which the selective epitaxy would be performed may be expanded length and/or width-wise to the determined maximum area or by a certain value, for example, equal to two times the length/width of the given area. In 512, it may be determined whether this area intersects with the p-channel region layer on both sides. If not, in 514, the site is determined to be an acceptable seed site. If so, in 516, the site is determined to not be an acceptable seed site.

Figure 6:
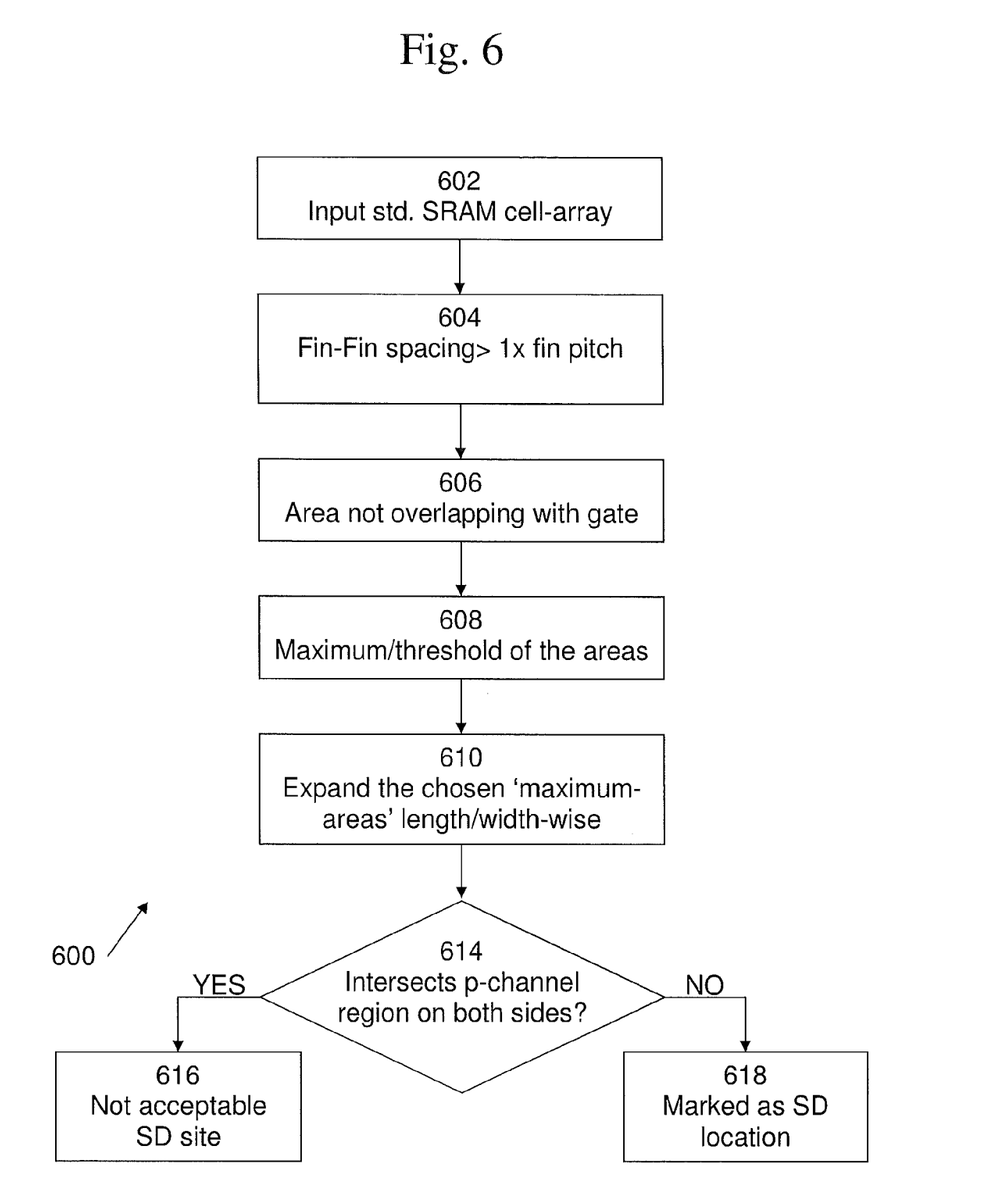
FIG. 6 is a proposed flow diagram of an SRAM layout process for FIN-FET designs with hybrid channels (different n and p type channel materials).

An exemplary flow diagram of an SRAM layout process 600 for FIN-FET designs is shown in FIG. 6. In this example, the cavity open location may be either cell merge or active not under gate. Process 600 begins with 602, in which a standard SRAM cell array may be input to, or received by, process 600. In 604, the spacing between fins of adjacent transistors is checked to determine whether the spacing is greater than a threshold, such as the fin pitch. In 606, it may be determined whether or not the area in which the selective epitaxy would be performed would overlap with a gate at the identified spacing. In 608, the maximum area in which the selective epitaxy would be performed that would not overlap with a gate at the identified spacing may be determined. This may done either by choosing the 'maximum areas' or by choosing areas above a certain pre-determined amount (for example, from 50-100% of the maximum area.) In 610, the area in which the selective epitaxy would be performed may be expanded length and/or width-wise to the determined maximum area or by a certain value, for example, equal to two times the length/width of the given area. In 612, it is determined whether this area intersects with the p-channel region layer on both sides. If not, in 614, the site is determined to be an acceptable seed site. If so, in 616, the site is determined to not be an acceptable seed site.

As a further embodiment, a select number of seed sites (as determined from the flow in FIG. 5 or 6) may be chosen to actually place a seed site. This choice may be made based on the number of desired seed sites per SRAM cell in a cell array, as will be described in subsequent sections.

Figure 7:
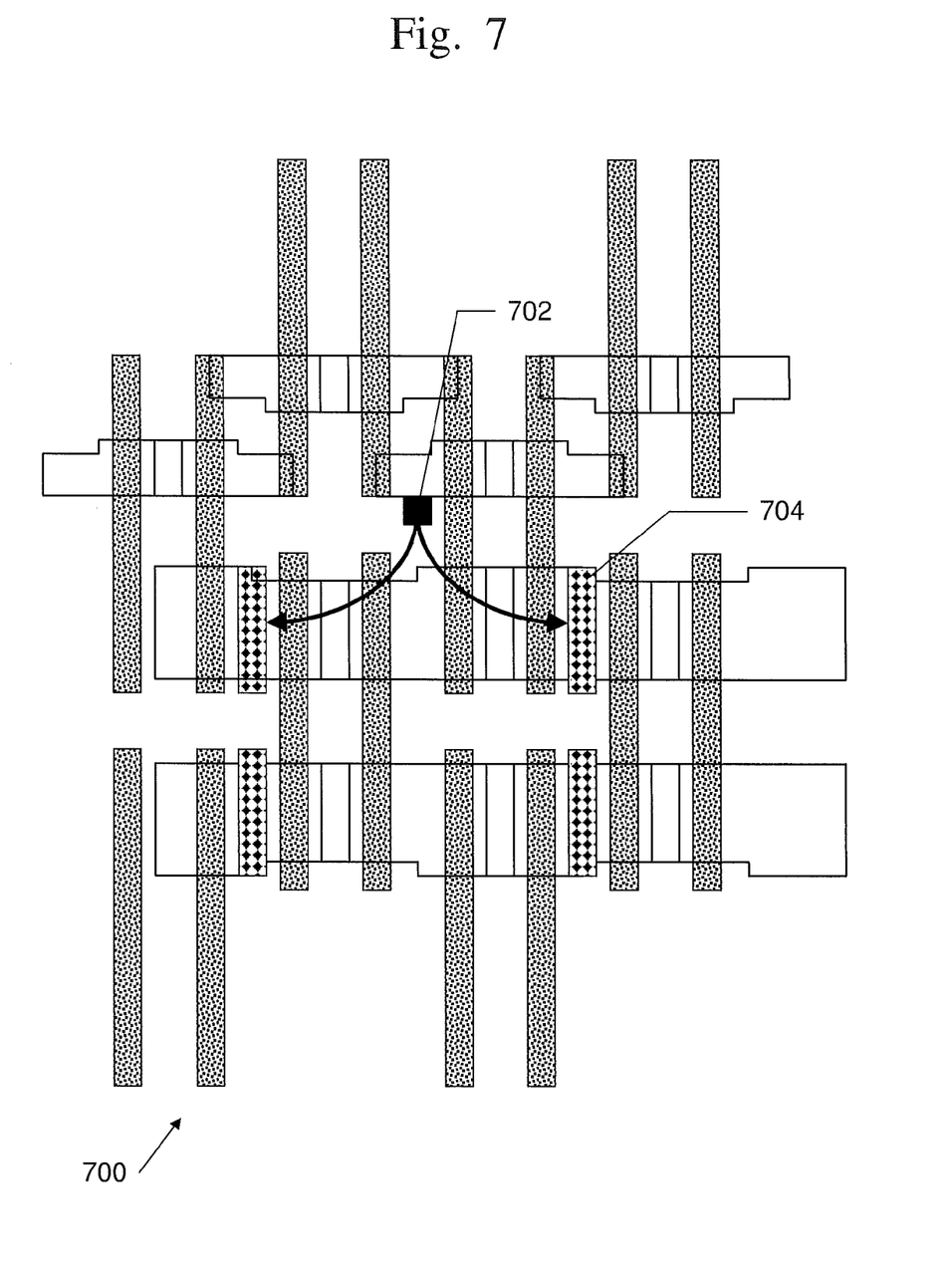
FIG. 7 is an exemplary diagram of seed and cavity opening placement in a single cell based on the proposed flow in FIG. 5.
Figure 8:
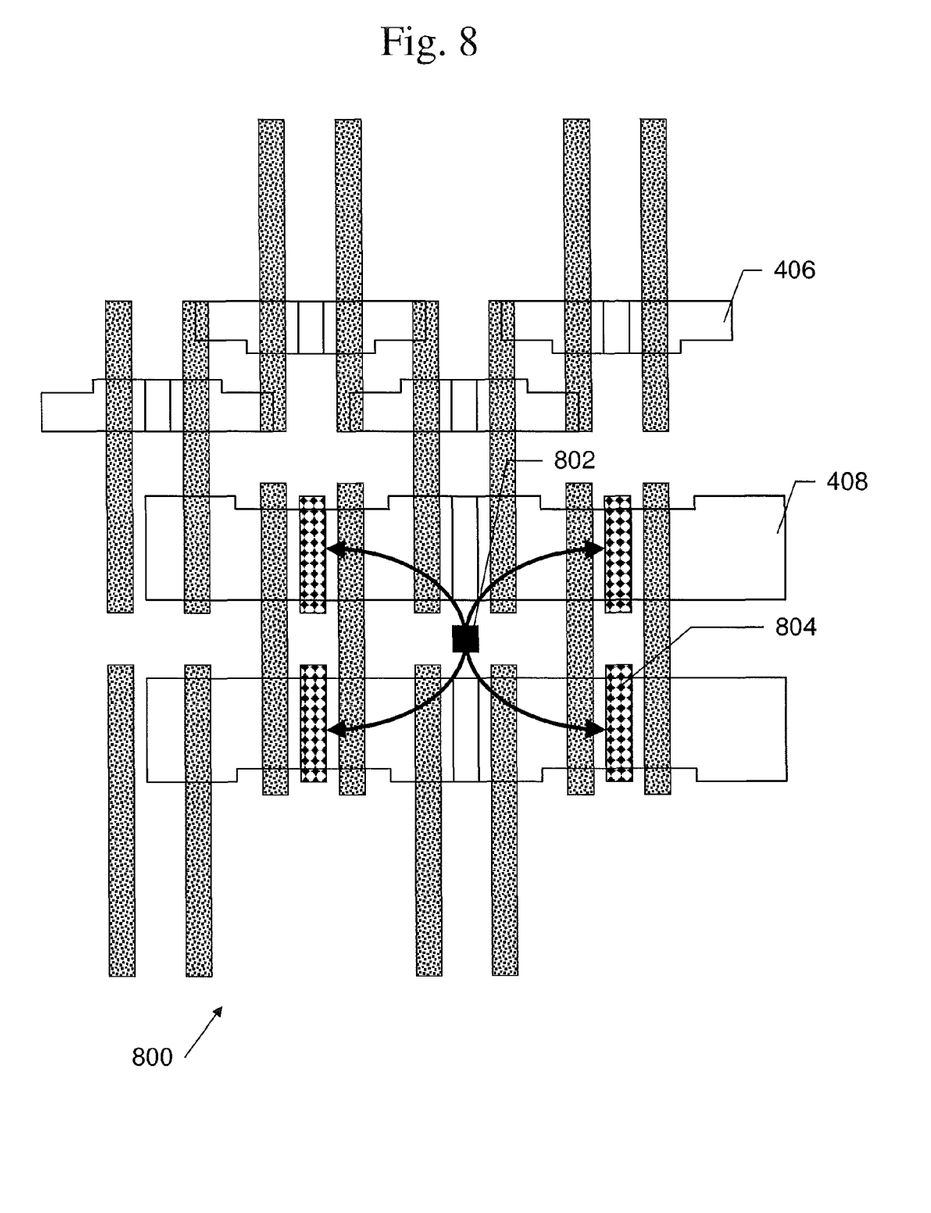
FIG. 8 is an exemplary diagram of seed and cavity opening placement in a single cell based on the proposed flow in FIG. 5.
Figure 9:
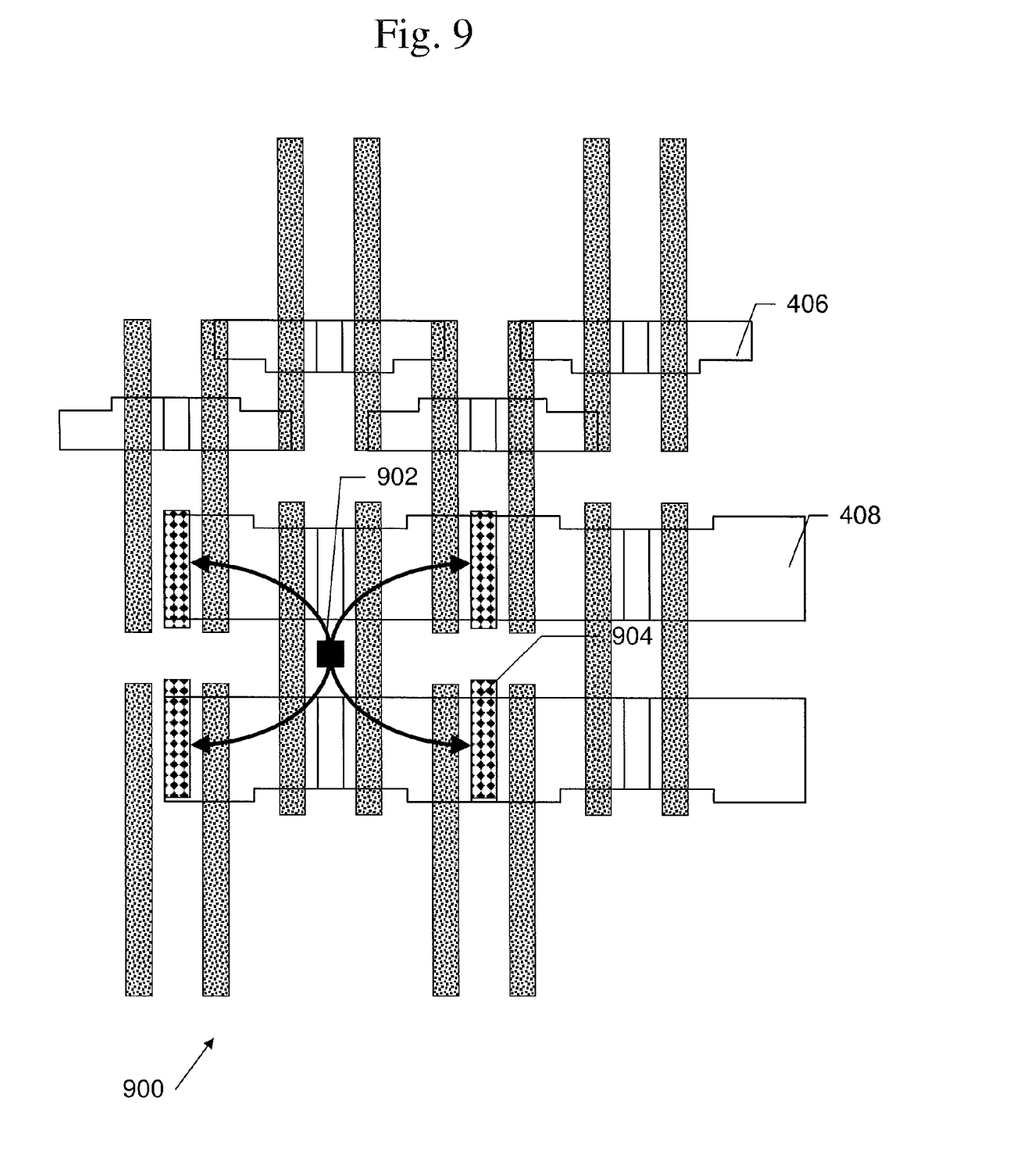
FIG. 9 is an exemplary diagram of seed and cavity opening placement in a single cell based on the proposed flow in FIG. 5.

Examples of seed and cavity opening placement in a single cell are shown in FIGS. 8-9. These examples are for the case where at least one seed is present in each single cell. The cavity open openings may be overlapped at the edge of single cells leading to crystals merging. The merging may to occur in the source/drain area of the FET in order to maintain full operation. In the exemplary array 700, shown in FIG. 7, the seed 702 is placed in the access transistor and the cavity openings, such as 704, may be placed from that location. In the exemplary array 800, shown in FIG. 8, the seed 802 is placed on the voltage supply line and the cavity openings, such as 804, may be placed from that location. In this example, the seed openings may be overlapped between single cells if they are placed on the periphery of a single cell. In the exemplary array 900, shown in FIG. 9, the seed 902 is placed on the bit line of the SRAM cell array and the cavity openings, such as 904, may be placed from that location. For the placement operation, complexity may be evaluated as a number of "transistors per seed." For these examples, there are 4 transistors per seed for the examples shown in FIGS. 7 and 9, and 8 transistors per seed for the example shown in FIG. 8.

Figure 10:
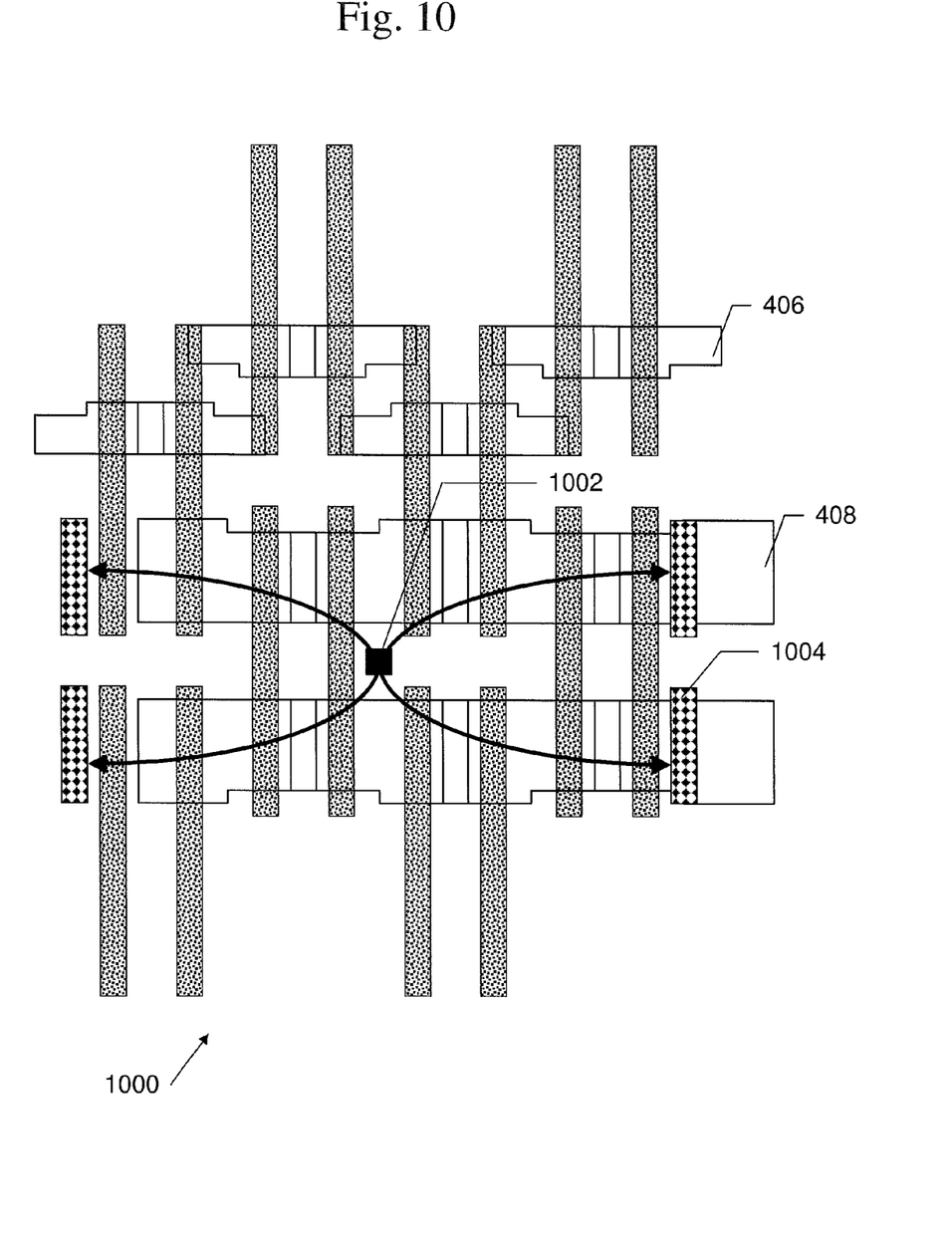
FIG. 10 is an exemplary diagram of seed and cavity opening placement where there is less than one seed per SRAM cell.
Figure 11:
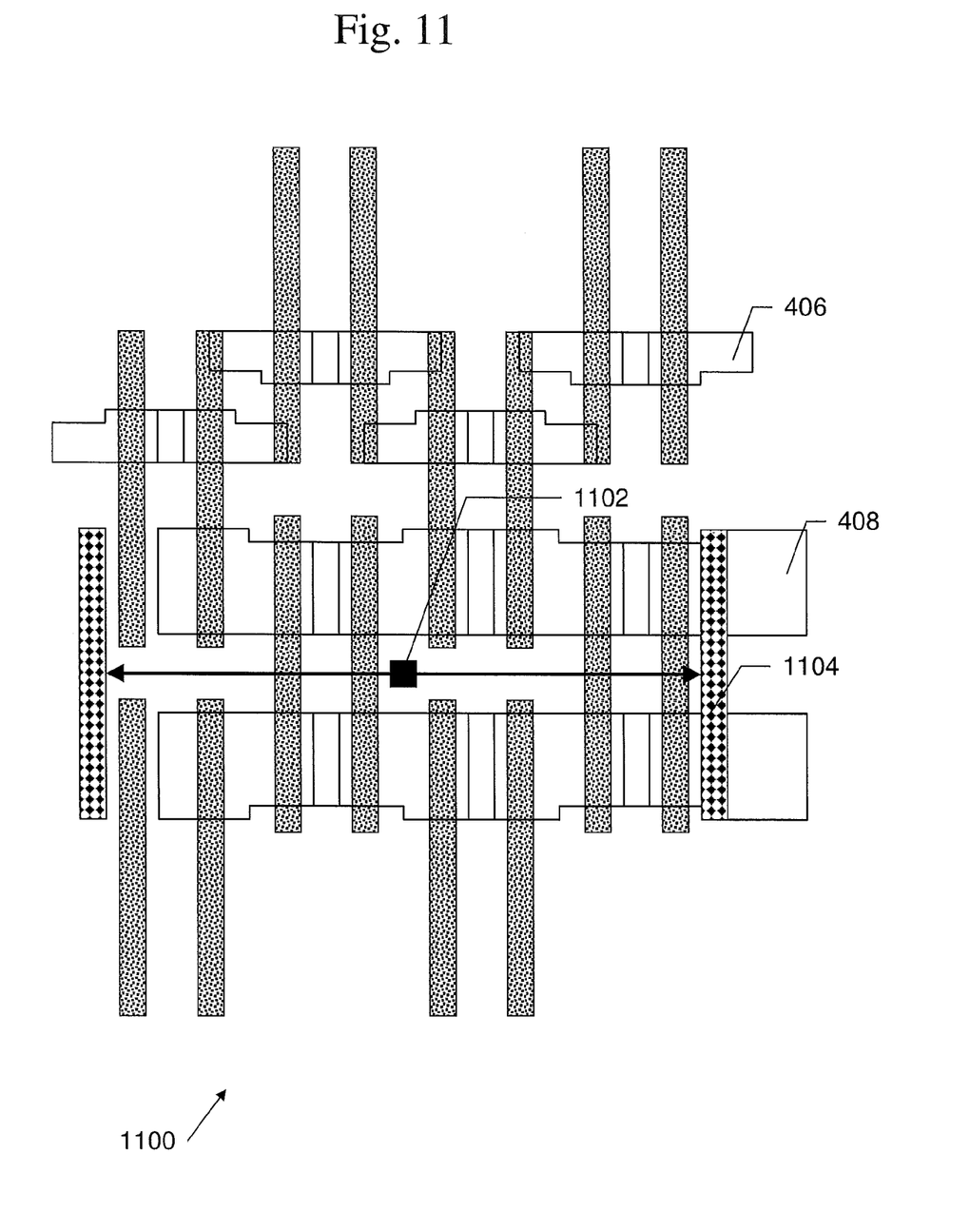
FIG. 11 is an exemplary diagram of seed and cavity opening placement where there is less than one seed per SRAM cell.

Examples of seed and cavity opening placement where there is less than one seed per SRAM cell are shown in FIGS. 10-11. Such an arrangement may be needed if density requirements for sub 10 nm nodes are too strong to fit at least one seed in each cell. In the exemplary array 1000, shown in FIG. 10, the seed 1002 is placed and the cavity openings, such as 1004, may be placed in a row along the indicated paths. This technique allows long rows of, for example, nFETs to be grown separately. In the exemplary array 1100, shown in FIG. 11, the seed 1102 is placed and the cavity openings, such as 1104, may be grown in a larger area and then patterned to form the individual nFETs. This technique allows more than two rows of nFETs to be grown at once, but requires the epitaxy to go over the pFET channel material. An additional approach that may be used with less than one seed per SRAM cell is a Bi-periodic design, which includes not only a periodic repetition of dense single SRAM cells, but an occasional larger spacing between two rows of cells in order to fit the seed and cavity open regions. Such a design may be advantageous especially for sub 7 nm nodes, which may have insufficient space to fit seed and cavity open features in a densely packed SRAM array.

Figure 12:
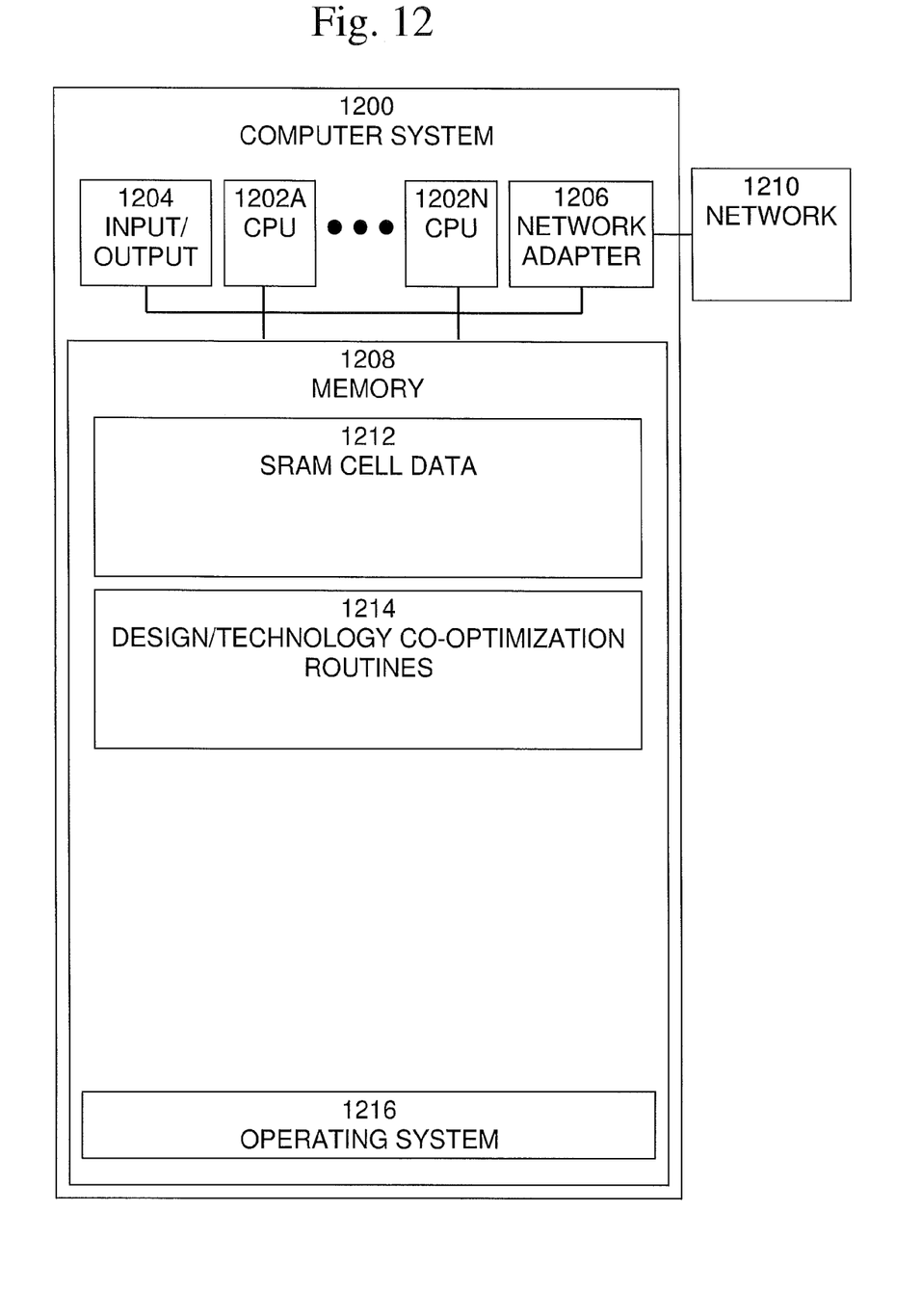
FIG. 12 is an exemplary block diagram of a computer system in which processes involved in the embodiments described herein may be implemented.

An exemplary block diagram of a computer system 1200, in which processes involved in the embodiments described herein may be implemented, is shown in FIG. 12. Computer system 1200 is typically a programmed general-purpose computer system, such as an embedded processor, system on a chip, personal computer, workstation, server system, and minicomputer or mainframe computer. Computer system 1200 may include one or more processors (CPUs) 1202A-1202N, input/output circuitry 1204, network adapter 1206, and memory 1208. CPUs 1202A-1202N execute program instructions in order to carry out the functions of the present invention. Typically, CPUs 1202A-1202N are one or more microprocessors, such as an INTEL PENTIUM® processor. FIG. 12 illustrates an embodiment in which computer system 1200 is implemented as a single multi-processor computer system, in which multiple processors 1202A-1202N share system resources, such as memory 1208, input/output circuitry 1204, and network adapter 1206. However, the present invention also contemplates embodiments in which computer system 1200 is implemented as a plurality of networked computer systems, which may be single-processor computer systems, multi-processor computer systems, or a mix thereof.

Input/output circuitry 1204 provides the capability to input data to, or output data from, computer system 1200. For example, input/output circuitry may include input devices, such as keyboards, mice, touchpads, trackballs, scanners, analog to digital converters, etc., output devices, such as video adapters, monitors, printers, etc., and input/output devices, such as, modems, etc. Network adapter 1206 interfaces device 1200 with a network 1210. Network 1210 may be any public or proprietary LAN or WAN, including, but not limited to the Internet.

Memory 1208 stores program instructions that are executed by, and data that are used and processed by, CPU 1202 to perform the functions of computer system 1200. Memory 1208 may include, for example, electronic memory devices, such as random-access memory (RAM), read-only memory (ROM), programmable read-only memory (PROM), electrically erasable programmable read-only memory (EEPROM), flash memory, etc., and electro-mechanical memory, such as magnetic disk drives, tape drives, optical disk drives, etc., which may use an integrated drive electronics (IDE) interface, or a variation or enhancement thereof, such as enhanced IDE (EIDE) or ultra-direct memory access (UDMA), or a small computer system interface (SCSI) based interface, or a variation or enhancement thereof, such as fast-SCSI, wide-SCSI, fast and wide-SCSI, etc., or Serial Advanced Technology Attachment (SATA), or a variation or enhancement thereof, or a fiber channel-arbitrated loop (FC-AL) interface.

The contents of memory 1208 may vary depending upon the function that computer system 1200 is programmed to perform. In the example shown in FIG. 12, exemplary memory contents are shown representing routines and data for embodiments of the processes described above. However, one of skill in the art would recognize that these routines, along with the memory contents related to those routines, may not be included on one system or device, but rather may be distributed among a plurality of systems or devices, based on well-known engineering considerations. The present invention contemplates any and all such arrangements.

In the example shown in FIG. 12, memory 1208 may include SRAM cell data 1212, and design/technology co-optimization routines 1214, and operating system 1216. For example, SRAM cell data 1212 may include data representing a standard SRAM cell array that is input to, or received by, computer system 1200. Design/technology co-optimization routines 1214 may include routines to implement processes such as those shown in FIGS. 5 and 6 above. Operating system 1226 provides overall system functionality.

As shown in FIG. 12, the present invention contemplates implementation on a system or systems that provide multi-processor, multi-tasking, multi-process, and/or multi-thread computing, as well as implementation on systems that provide only single processor, single thread computing. Multi-processor computing involves performing computing using more than one processor. Multi-tasking computing involves performing computing using more than one operating system task. A task is an operating system concept that refers to the combination of a program being executed and bookkeeping information used by the operating system. Whenever a program is executed, the operating system creates a new task for it. The task is like an envelope for the program in that it identifies the program with a task number and attaches other bookkeeping information to it. Many operating systems, including Linux, UNIX®, OS/2®, and Windows®, are capable of running many tasks at the same time and are called multitasking operating systems. Multitasking is the ability of an operating system to execute more than one executable at the same time. Each executable is running in its own address space, meaning that the executables have no way to share any of their memory. This has advantages, because it is impossible for any program to damage the execution of any of the other programs running on the system. However, the programs have no way to exchange any information except through the operating system (or by reading files stored on the file system). Multi-process computing is similar to multi-tasking computing, as the terms task and process are often used interchangeably, although some operating systems make a distinction between the two.

The present invention may be a system, a method, and/or a computer program product at any possible technical detail level of integration. The computer program product may include a computer readable storage medium (or media) having computer readable program instructions thereon for causing a processor to carry out aspects of the present invention. The computer readable storage medium can be a tangible device that can retain and store instructions for use by an instruction execution device.

The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A computer-implemented method for CMOS manufacturing a hybrid integrated circuit comprising:
   receiving, at a hardware processor, data representing a layout of a static random-access memory cell array;
   identifying, by the hardware processor, areas between active channel regions that do not overlap with transistor gates of static random-access memory cells of the static random-access memory cell array;
   selecting, by the hardware processor, from among the identified areas at least one area;
   expanding, by the hardware processor, the selected areas to determine whether the expanded area intersects with a p-doped active Si semiconductor or p-channel semiconductor area; and
   marking, by the hardware processor, as Si seed locations the identified expanded areas that do not intersect on both sides with a channel active transistor region, and
   growing a III-V layer of semiconductor material at a marked seed location by selective epitaxy.

2. The method of claim 1, wherein each selected area is expanded length-wise, width-wise, or both, to a maximum area or by a pre-determined amount.

3. The method of claim 1, wherein the hybrid integrated circuit comprises Si or SiGe static random-access memory circuits and the III-V semiconductor material.

4. The method of claim 3, wherein the III-V semiconductor material is InGaAs.

5. The method of claim 4, further comprising:
   determining, by the hardware processor, whether a spacing between active areas in the layout of the static random-access memory cell array is greater than a diameter of a Si seed.

6. The method of claim 4, wherein the static random-access memory cell array comprises fin field effect transistors, and the method further comprises:
   determining, by the hardware processor, whether a spacing between fins of adjacent transistors is greater than a fin pitch of the fin field effect transistors.

7. A computer program product for CMOS manufacturing a hybrid integrated circuit, the computer program product comprising a non-transitory computer readable storage having program instructions embodied therewith, the program instructions executable by a computer, to cause the computer to perform a method comprising:
   identifying areas between active channel regions that do not overlap with transistor gates of static random-access memory cells of the static random-access memory cell array;
   selecting from among the identified areas at least one area;
   expanding the selected areas to determine whether the expanded area intersects with a p-doped active Si semiconductor or p-channel semiconductor area; and
   marking as Si seed locations the identified expanded areas that do not intersect on both sides with a channel active transistor region, and
   growing a III-V layer of semiconductor material at a marked seed location by selective epitaxy.

8. The computer program product of claim 7, wherein each selected area is expanded length-wise, width-wise, or both, to a maximum area or by a pre-determined amount.

9. The computer program product of claim 7, wherein the hybrid integrated circuit comprises Si or SiGe static random-access memory circuits and the III-V semiconductor material.

10. The computer program product of claim 9, wherein the III-V semiconductor material is InGaAs.

11. The computer program product of claim 10, wherein the program instructions further causes the computer to perform:
    determining whether a spacing between active areas in the layout of the static random-access memory cell array is greater than a diameter of a Si seed.

12. The computer program product of claim 10, wherein the static random-access memory cell array comprises fin field effect transistors, and the program instructions further causes the computer to perform:
    determining whether a spacing between fins of adjacent transistors is greater than a fin pitch of the fin field effect transistors.

13. A system for CMOS manufacturing a hybrid integrated circuit, the system comprising:
    a processor,
    a memory accessible by the processor, and computer program instructions stored in the memory and executable by the processor to perform a method to:
    receive data representing a layout of a static random-access memory cells of a static random-access memory cell array;
    identify areas between active channel regions that do not overlap with transistor gates of static random-access memory cells of the static random-access memory cell array;
    selecting from among the identified areas at least one area;
    expand the selected areas to determine whether the expanded area intersects with a p-doped active Si semiconductor or p-channel semiconductor area; and
    mark as Si seed locations the identified expanded areas that do not intersect on both sides with a channel active transistor region, and
    grow a III-V layer of semiconductor material at a marked seed location by selective epitaxy.

14. The system of claim 13, wherein to expand the selected areas, said processor is further configured to: expand each selected area length-wise, width-wise, or both, to a maximum area or by a pre-determined amount.

15. The system of claim 13, wherein the hybrid integrated circuit comprises Si or SiGe static random-access memory circuits and the III-V semiconductor material.

16. The method of claim 15, wherein the III-V semiconductor material is InGaAs.

17. The system of claim 16, wherein said processor is further configured to:
- determine whether a spacing between active areas in the layout of the static random-access memory cell array is greater than a diameter of a Si seed.

18. The system of claim 16, wherein the static random-access memory cell array comprises fin field effect transistors, and the processor is further configured to:
- determine whether a spacing between fins of adjacent transistors is greater than a fin pitch of the fin field effect transistors.

\* \* \* \* \*